United States Patent [19]
Smith

[11] Patent Number: 5,998,733
[45] Date of Patent: Dec. 7, 1999

[54] GRAPHITE ALUMINUM METAL MATRIX COMPOSITE MICROELECTRONIC PACKAGE

[75] Inventor: Carl R. Smith, Crystal Lake, Ill.

[73] Assignee: Northrop Grumman Corporation, Los Angeles, Calif.

[21] Appl. No.: 08/944,159

[22] Filed: Oct. 6, 1997

[51] Int. Cl.[6] .................................................. H05K 5/06
[52] U.S. Cl. ............................ 174/50.52; 174/50.61; 174/52.3; 174/152 GM
[58] Field of Search ..................... 174/50.52, 50.61, 174/52.3, 152 GM

[56] References Cited

U.S. PATENT DOCUMENTS

| | | | |
|---|---|---|---|
| 2,071,597 | 2/1937 | Vasselli | 174/50.61 X |
| 4,806,704 | 2/1989 | Beike et al. | 174/52.4 |
| 4,961,106 | 10/1990 | Butt et al. | 357/74 |
| 5,001,299 | 3/1991 | Hingorany | 174/52.4 |
| 5,039,577 | 8/1991 | Knoell et al. | 428/650 |
| 5,163,499 | 11/1992 | Newkirk et al. | 164/98 |
| 5,227,587 | 7/1993 | Paterek | 174/50.61 X |
| 5,347,426 | 9/1994 | Dermarkar et al. | 361/708 |

*Primary Examiner*—Dean A. Reichard
*Attorney, Agent, or Firm*—Terry J. Anderson; Karl J. Hoch, Jr.

[57] ABSTRACT

An electronic package includes a graphite-aluminum metal matrix composite (MMC) housing or support member that dissipates heat from an electronic component or circuit and a hermetic glass feedthrough seal between the graphite-aluminum MMC material and one or more electrical feedthrough pins or wires connected to the electronic component. The glass feedthrough seal comprises a low melting point, low coefficient of expansion (CTE) solder glass, such as lead zinc borosilicate, effective to form a hermetic glass-to-composite seal by a combined chemical and mechanical compression sealing force. The vitreous solder glass preferably exhibits a CTE in the range of about 41 to about 78 ppm/degree C. and a melting temperature in the range of about 300 to about 500 degrees C.

13 Claims, 3 Drawing Sheets

GRAPHITE ALUMINUM METAL MATRIX COMPOSITE MICROELECTRONIC PACKAGE

FIELD OF THE INVENTION

The present invention relates to a light weight, high thermal conductivity graphite-aluminumm metal matrix composite electronic package having a hermetic glass feedthrough seal.

BACKGROUND OF THE INVENTION

The next generation of high performance electronic packages will place emphasis on increasing packaging and thermal densities, improving reliability, and reducing weight. High performance electronics subsystems and systems will continue to incorporate increasing quantities of monolithic microwave integrated circuits (MMIC's) and application specific integrated circuits (ASIC's). Such high performance microelectronic packages including multichip modules (MCM's) will create thermal management challenges for the electronic package designer.

Conventional materials used heretofore in manufacture of microelectronics packaging include aluminum, Kovar, molybdenum, and copper-molybdenum-copper. For example, Kovar microelectronic packages comprise a Kovar housing and Kovar feedthrough pin or wire material and glass seals between the housing and feedthroughs. The coefficient of thermal expansion (CTE) of the sealing glass and the Kovar components are matched to provide a hermetic seal. Moreover, the sealing glass is selected to melt below the critical temperature for the Kovar feedthrough material. A critical transgranular and intergranular oxide are formed and controlled to create the final hermetic seal.

However, such conventional package housing materials do not meet today's high performance system requirements such as a low coefficient of thermal expansion, high thermal conductivity, high stiffness and low density. As a result, composite materials have been proposed in an attempt to meet these high performance system requirements. For example, graphite-aluminum metal matrix composite (MMC) materials meet these requirements from the standpoint of exhibiting a weight savings of 65% when used in lieu of conventional Kovar as the package housing material. Moreover, graphite-aluminum MMC materials exhibit a thermal conductivity that is six to ten times greater than that of Kovar material and can be produced by relatively low cost casting operations to shapes that are readily machinable.

In order to utilize the full potential of graphite-aluminum MMC materials for electronic packaging, there is a need to provide a reliable, low leak rate (hermetic) seal between the graphite-aluminum MMC material and the electrical feedthroughs.

SUMMARY OF THE INVENTION

The present invention satisfies this need by providing in one embodiment an electronic package, as well as method of making same, comprising a graphite-metal matrix composite (MMC) housing or support member for dissipating heat from a heat generating electronic component and a hermetic glass feedthrough seal. The glass feedthrough seal comprises a low melting temperature, low coefficient of thermal expansion solder glass effective to form a glass-to-composite seal by combined chemical bond and mechanical compression sealing.

To this end, for a graphite-aluminum MMC housing or support member, the low melt temperature solder glass preferably exhibits a coefficient of thermal expansion (CTE) in the range of about 41 to about 78 ppm/degree C. and a melting temperature in the range of about 300 to about 500 degrees C. The CTE range set forth provides a CTE mismatch (compression load) with respect to the graphite-aluminum MMC material effective to provide a mechanical sealing force (compression load) in addition to chemical bond sealing.

The low melt temperature solder glass may be selected from one or more of lead borate, lead zinc borate, lead borosilicate, and lead zinc borosilicate (non-crystallizing or crystallizing). A preferred vitreous solder glass comprises lead zinc borosilicate.

The low melt temperature solder glass feedthrough seal may include reinforcement beads proximate thereto to improve the resistance of the glass seal to fracture resulting from bending of the feedthrough pin or wire and to reduce adherence of metallic plating to the glass seal during a subsequent metal plating operation. The reinforcement beads can be selected from a variety of materials chosen for CTE, melting point, and chemical resistance.

The glass feedthrough seal is formed between graphite-aluminum MMC material and a metallic feedthrough connector by forming an assembly wherein the low melt temperature solder glass material with optional hard glass beads are disposed between the MMC material and the metallic connector. Then, the assembly is heated in an oxygen bearing atmosphere above a melting temperature of the glass material for a time to form a low leak rate glass feedthrough seal.

The present invention will become more readily apparent from the following detailed description of the invention taken with the following drawings.

DESCRIPTION OF THE INVENTION

Figure 1:
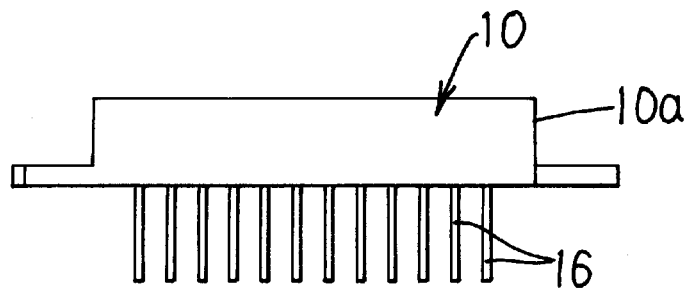
FIG. 1 is an elevational view of a typical electronic package having a graphite-aluminum housing and electrical feedthrough pins or wires extending through the housing for connection to a heat generating electronic component/circuit received therein.
Figure 2:
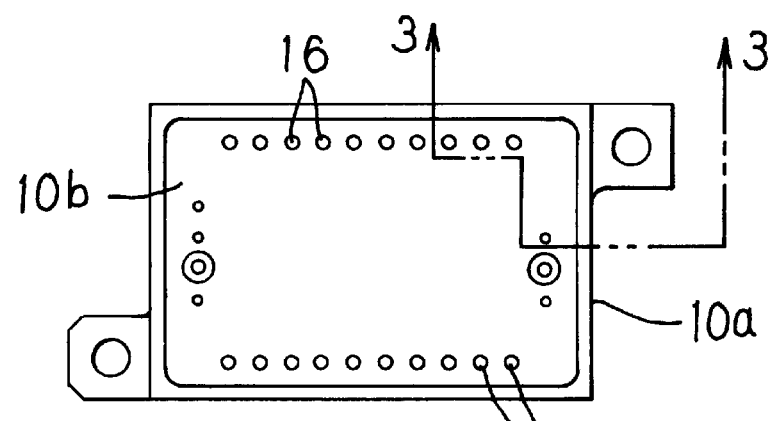
FIG. 2 is a top plan view of the electronic package of FIG. 1.
Figure 3:
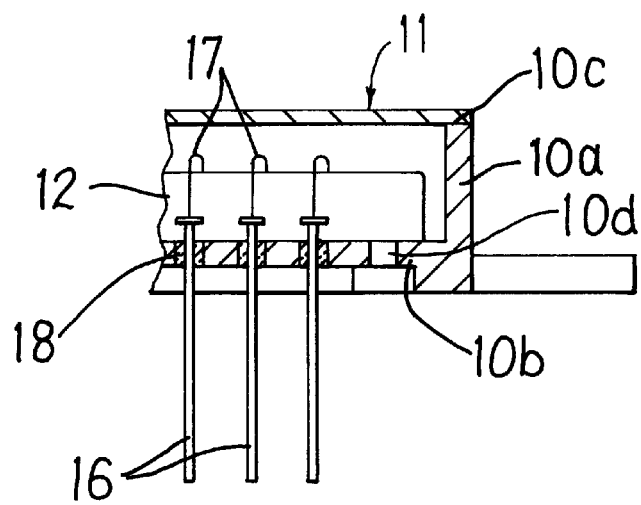
FIG. 3 is a partial, enlarged cross-sectional view taken along lines 3—3 of FIG. 2 illustrating electrical pins or wires hermetically sealed in the graphite-aluminum MMC housing by solder glass seals in accordance with the invention.

Referring to FIGS. 1–3, the present invention provides a microelectronic package comprising a graphite-aluminumm metal matrix composite (MMC) housing or support member 10 that receives or supports a heat generating electronic component or circuit 12 (shown schematically in FIG. 3) which can comprise a ceramic or other insulating substrate having one more electrical circuits or other electronic components thereon that generate heat during operation. For purposes of illustration only and not limitation, the electronic component can comprise a multichip module (MCM), a microwave integrated circuit (MIC), application specific integrated circuit (ASIC), monolithic microwave integrated circuit (MMIC) or other electronic device(s) on the substrate. The heat emitted by the electronic component is dissipated by the high thermal conductivity MMC package housing or support material to maintain temperature of the electronic component within a proper operating range.

The package housing or support member 10 is illustated as having sidewalls 10a and a floor wall 10b defining a receptable for receiving the electronic component or circuit 12. As shown in FIG. 3, a cover 11 is joined on the upper surface 10c of sidewalls 10a by laser sealing or eutectic solder to hermetically seal the electronic component or circuit 12 therein. The cover 11 is comprised of aluminum material or other suitable material. The invention is not limited to any particular package housing or support configuration, which can range from a simple flat configuration to a variety of complex (multiple cavity) configurations.

The package housing or support member 10 preferably comprises a MMC material having a graphite component typically comprising at least 90% volume fraction of the material. For example, a representative MMC material can comprise about 70 to about 90 volume % graphite particles and the balance aluminum mixed and bonded together by casting fabrication or other infiltration techniques. Such an MMC material is commercially available from the Cercast Group having an address at 3905 Industrial Blvd., Montreal, Quebec, H1H 2Z2 Canada.

The invention can be practiced using other graphite-aluminum MMC materials, however, wherein the proportion of graphite and aluminum is varied to provide desired thermal conductivity, weight, strength, and other properties of interest for a particular service application. In general, the volume % of graphite in the MMC material can range from about 70 to 90 volume %, although the invention is not limited to any particular proportion of graphite and aluminum. The efficacy of the hermetic seal is dependent on the the CTE of the MMC material, which is a function of the volume fraction of graphite present. Morever, the graphite and aluminum components of the MMC material can be in forms other than particles such as whiskers with the component materials united together in any suitable manner to form the housing or support member 10. The MMC package housing or support 10 can be formed to a desired configuration by machining a monolithic graphite-aluminum MMC material or by casting the MMC material to near net shape or net shape, or other suitable fabrication techniques.

Referring to FIG. 3, one or more electrical feedthrough metallic connectors 16, such as Kovar pins or wires, are shown extending through openings 10d in the floor wall 10b of the package housing or support member 10 and are connected to respective regions of the electronic component 12 by conventional means, such as fine wires 17. One opening 10d is shown without a pin therein only for purposes of illustrating the opening. The Kovar pins 16 are plated with Ni and Au after firing of the glass feedthrough. Although vertical feedthrough connectors 16 are illustrated in FIGS. 1–3, the invention is not so limited in that the feedthroughs can be at horizontal and other orientations as well. Each feedthrough connector 16 is hermetically sealed in a respective opening 10d by a glass feedthrough seal 18 in accordance with the present invention.

The glass feedthrough seal 18 comprises a low melting point, low coefficient of thermal expansion, low melt temperature solder glass effective to form a hermetic glass-to-composite seal by providing a combined chemical bond and mechanical compression sealing force (compression load) between the graphite-aluminum MMC housing material and the feedthrough connector 16. A solder glass seal in accordance with the invention includes a glass material that is characterized as having a CTE of about 41 to about 78 parts per million (ppm)/degree C., a melting temperature of about 300 to about 500 degrees C., and that forms both a chemical and mechanical seal to the graphite-aluminum MMC material.

The CTE range set forth provides a CTE mismatch (mechanical compression load) with respect to the graphite-aluminum MMC material, which is effective to provide mechanical sealing force in addition to chemical bond sealing. When the MMC material comprises 90 volume % graphite and the balance aluminum, a compression load in the range of about 100 to about 150 ppm/degree C. is provided by the aforementioned CTE range set forth for the vitreous solder glass.

For purposes of illustration and not limitation, the low melt temperature solder glass may be selected from lead borate, lead zinc borate, lead borosilicate, and lead zinc borosilicate (non-crystallizing or crystallizing). A preferred solder glass comprises lead zinc borosilicate.

Such low melt temperature glass materials are available in the form of spherical beads from Electroglass Products, Route 981, Norvelt, Pa. 15674 and other sources set forth below. The vitreous solder glass beads typically can be used in the size range of 0.042 inch to 0.099 inch diameter in the practice of the invention, although the invention is limited to any particular size of glass beads.

Table I below lists representative low melt temperature solder glasses that can be used in the practice of the invention and certain properties (e.g. CTE, softening temperature, annealing temperature and density) of the glasses. However, this listing is offered only for purposes of illustration and not limitation as other low melt temperature solder glasses may be used. The glass numbers are glass sample numbers.

TABLE I

| Glass Number | Glass Type | CTE | Softening Temp. | Annealing Temp | Density |
| --- | --- | --- | --- | --- | --- |
| CGS-1002 | Lead Zinc Borosilicate (crystalizing) | 69 | 380 | 318 | 5.85 |
| CGS-1003 | Lead Zinc Borosilicate (crystalizing) | 89 | 380 | N/A | 3.80 |
| CGV-1004 | Lead Borosilicate | 64 | 352 | 2.98 | 5.33 |
| CGV-1005 | Lead Borosilicate | 83 | 447 | 376 | 5.46 |
| CGV-1006 | Lead Zinc Borate | 68 | 365 | 309 | 5.10 |
| CGV-1008 | Lead Zinc Borosilicate | 64 | 370 | 310 | 6.80 |
| CGV-1009 | Lead Borate | 41 | 571 | 469 | 4.07 |

Glass sample number CGS-1002 of Table I is available as package sealant solder glass under designation CV111 from Owens-Illinois, Inc., Technical Products, One Seagate—

LDP, Toledo, Ohio 43666, and glass sample numbers CGV-1004 and CGV-1008 are available as solder glass under designations SG-350 and SG-95, repsectively, from OI-NEG TV Products, Inc., One Seagate—52L SG, Toledo, Ohio 43666. The other glasses with listed properties of Table I and beads of Table II likewise are commercially available from these sources.

Figure 1A:
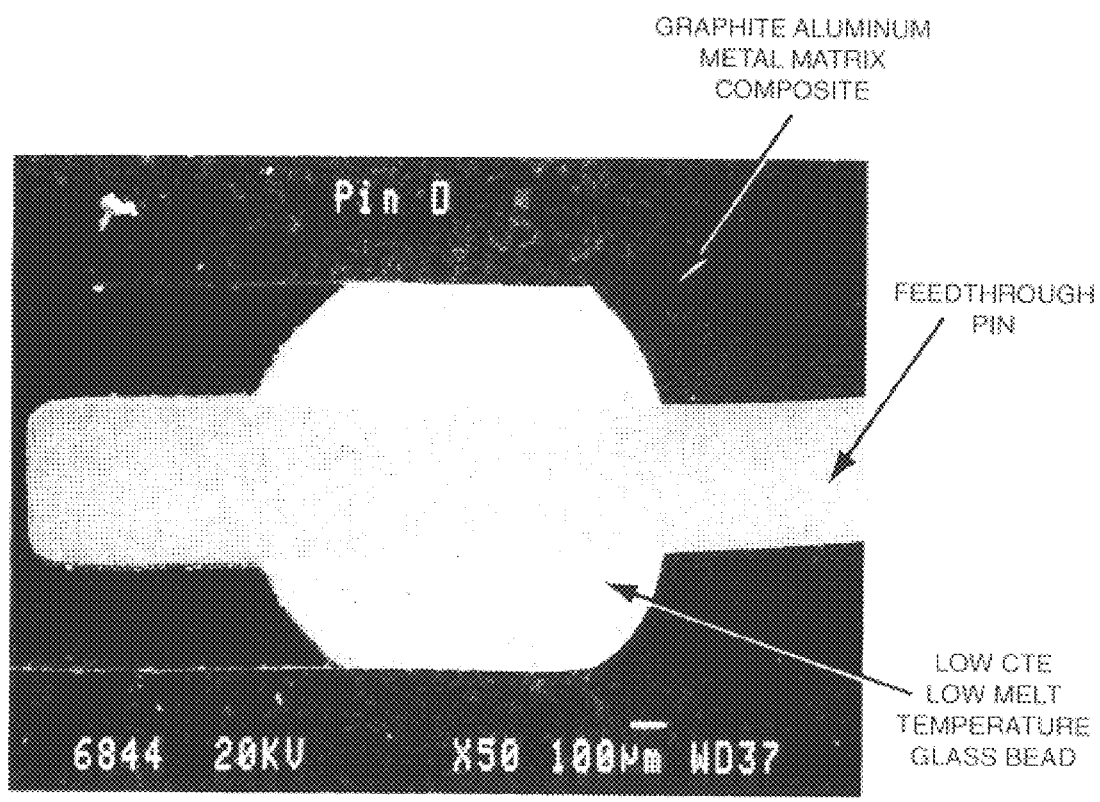
FIG. 1A is a scanning electron micrograph of a glass seal formed in a MMC member.
Figure 1B:
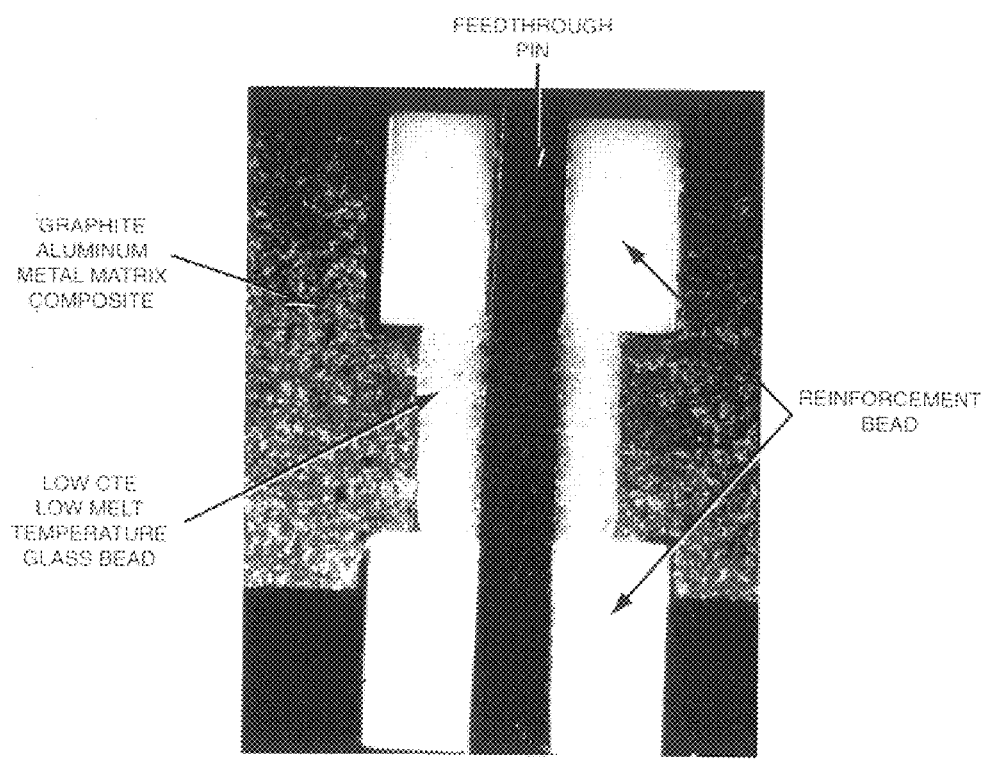
FIG. 1B is a scanning electron micrograph of a glass seal in an MMC member with ceramic reinforcement beads disposed about the seal for additional seal crack resistance.

The low melt temperature solder glass feedthrough seal 18 may include relatively hard reinforcement cover beads, FIG. 1B, thereon to improve fracture resistance of the glass feedthrough seal resulting from bending of the feedthrough pin or wire 16 and to reduce or prevent adherence of metallic plating to the glass feedthrough seal during subsequent housing and electrical feedthrough plating operations. The beads are relatively harder as compared to the hardness of the solder glass to this end. The reinforcement beads can be selected from a variety of materials chosen for hardness, CTE, melting point, and chemical resistance to subsequent metal plating operations. Table II below lists representative beads that can be incorporated on an outer surface of the glass feedthrough seal in accordance with the invention, e.g. see FIG. 1B. However, this listing is offered only for purposes of illustration and not limitation as other reinforcement beads may be used.

MMC base on which the housing or support is positioned. The fixture is made of graphite-aluminum MMC to match to the CTE of the package MMC material during the heating operation to form the glass feedthrough seals 18. The feedthrough connectors 16 are held in position in the floor openings 10d by connector locating function features of the fixture made of graphite-aluminum MMC.

Low melt temperature solder glass beads of selected composition and particle size are then disposed about the feedthrough connectors 16 in the floor openings 10d. The glass beads are held in position by the graphite-aluminum MMC fixture and the housing configuration. As mentioned hereabove, the solder glass beads optionally can be covered or surrounded on the outer periphery with the relatively hard, reinforcement beads as described hereabove and shown in FIG. 1B.

The assembly of the package housing or support, feedthrough connectors and unfired glass seal beads is heated in a furnace to form the glass feedthrough seal in-situ between the feedthrough connectors and the graphite-aluminum MMC housing or suppport material.

Heating of the assembly is conducted in an oxygen bearing furnace atmosphere when the electronic package includes the above-described 90 volume % graphite-balance

TABLE II

| Glass Number | Glass Type | CTE | Softening Temp. | Annealing Temp | Density |
|---|---|---|---|---|---|
| CGX-1001 | Aluminum Oxide (96%) | 64 | Hard Fired | N/A | |
| CGC-2001 | Alkali Barium (Low Lead) | 87 | 663 | N/A | 2.47 |
| CGM2002 | Lithia Potash Borosilicate | 32 | 762 | N/A | 2.03 |

The reinforcement beads are disposed about the respective solder glass seal which is disposed in a respective opening 10d about the feedthrough connector 16, FIG. 1B, during the firing operation with the package housing or support member 10 and connectors 16 fixtured in position relative to one another by suitable fixtures having CTE properties matched to those of the housing or support material and feedthrough connectors.

In manufacture of an electonic package in accordance with a method embodiment of the invention, the graphite-aluminum MMC package housing or support member 10 typically is cleaned thoroughly by initial immersion in a room temperature 10% by volume NaOH aqueous solution that is ultrasonically agitated for 3 to 5 minutes. The housing or support then is rinsed with de-ionized water at room temperature. These steps are repeated until visible particulates cease to release from the package housing or support.

Therafter, the housing or support is immersed in hot de-ionized water that is maintained at 98 degrees F. (37 degrees C.) and that is ultrasonically agitated for 2 to 3 minutes followed by rinsing in de-ionized water at room temperature. These steps are repeated until visible particulates cease to release from the package housing or support.

The package or support then is solvent cleaned by immersion in a beaker filled with room temperature isopropyl alcohol that is ultrasonically agitated for 3 to 5 minutes. This step is repeated until visible particulates cease to release from the package housing or support. Thereafter, the solvent cleaned housing or support is blown dry with a nitrogen gas gun and vacuum dried overnight.

The cleaned housing or support 10 then is clamped in a fixture (not shown) that engages side and feedthrough regions thereof. The fixture includes a graphite-aluminum aluminum MMC package housing or support material, unplated Kovar feedthrough connectors, and solder glass in order to achieve a reliable and low leak rate glass feedthrough seal. A preferred oxygen bearing furnace atmosphere comprises 80 volume % nitrous oxide and balance air, although other oxygen bearing atmospheres can be used such as for purposes of illustration including 22 volume % oxygen and balance air, and 80 volume % carbon dioxide and balance air. An oxygen bearing atmosphere is used in order to form a chemical bond between the glass seal and MMC by virtue of formation of an oxide layer between the glass seal and MMC.

The furnace heating/cooling cycle includes a ramp-up at 20 degrees C. per minute to 520 degrees C. followed by a 15 minute hold at 520 degrees C. in the oxygen bearing atmosphere (e.g. static or flowing 80% nitrous oxide-balance air atmosphere). Then, there is ramp-down at 10 degrees C. per minute to 318 degrees C. followed by a hold at 318 degrees C. for 40 minutes in the same atmosphere. The furnace cycle concludes with a cool down to room temerature in a static nitrogen atmosphere introduced in the furnace at the end of the hold at 318 degrees C.

FIG. 1A is a scanning electron micrograph of a lead zinc borosilicate solder glass seal formed between a 90 volume % graphite-balance aluminum MMC material and unplated, bare Kovar feedthrough pin (diameter of 0.018 inch) in an opening (diameter of 0.042 inch) using the method procedures described in detail hereabove. FIG. 1A illustrates that a glass feedthrough seal was effectively formed. The glass seal was leak tested per Mil-Std-883 procedure and exhibited a seal leak rate of $1 \times 10^{-8}$ atmospheres/cubic centimeters-second. The glass feedthrough seals produced in the manner described hereabove can meet a 50 ohm resistance feedthrough requirement established by an 0.099 inch diameter glass bead (dielectric value dependent).

FIG. 1B is a scanning electron micrograph of a similar solder glass feedthrough seal about a feedthrough pin in an MMC housing however with the glass seal covered or surrounded by the optional reinforcement beads shown to improve fracture resistance.

While the invention has been described in detail with respect to certain presently preferred embodiments and features, it will be understood by those skilled in the art in view of the present disclosure that various changes and modifications may be made without departing from the scope of the invention as set forth in the following claims.

I claim:

1. An electronic package comprising a graphite-metal matrix composite member for dissipating heat from a heat generating electronic component, an electrical feedthrough connector extending through an opening in said composite member, and a hermetic glass seal in said opening between said composite member and said feedthrough connector, said glass seal comprising a low melting point glass having a melting temperature in the range of about 300 to about 500 degrees C. and a coefficient of thermal expansion of about 41 to about 89 ppm/degree C. effective to form a glass-to-composite seal by mechanical compression sealing and chemical bond sealing.

2. The electronic package of claim 1 wherein said composite member comprises at least about 70 to about 90 volume percent of graphite and the balance essentially aluminum.

3. The electronic package of claim 1 wherein said glass is selected from the group consisting of lead borate, lead zinc borate, lead borosilicate, and lead zinc borosilicate.

4. The electronic package of claim 1 wherein said seal includes reinforcement disposed about the seal.

5. The electronic package of claim 4 wherein said reinforcement comprises a material that is relatively hard as compared to the hardness of said seal.

6. A hermetic seal between a graphite-aluminumm metal matrix composite material and a metallic member, said seal comprising a glass having a coefficient of thermal expansion in the range of about 41 to about 78 ppm/degree C. and a melting temperature in the range of about 300 to about 500 degrees C.

7. The seal of claim 6 wherein said glass is selected from the group consisting of lead borate, lead zinc borate, lead borosilicate, and lead zinc borosilicate.

8. The seal of claim 6 including reinforcement disposed about the seal.

9. The seal of claim 8 wherein said reinforcement comprises a material that is relatively hard as compared to the hardness of said seal.

10. An electronic package comprising a graphite-metal matrix composite member for dissipating heat from a heat generating electronic component, an electrical feedthrough connector extending through an opening in said composite member, and a hermetic glass seal in said opening between said composite member and said feedthrough connector, said glass seal comprising a low melting point glass having a melting temperature in the range of about 300 to about 500 degrees C. and a coefficient of thermal expansion in the range of about 41 to about 89 ppm/degree C.

11. The electronic package of claim 10 wherein said glass is selected from the group consisting of lead borate, lead zinc borate, lead borosilicate, and lead zinc borosilicate.

12. The electronic package of claim 10 wherein said seal includes reinforcement disposed about said seal, said reinforcement comprising a material that is relatively hard as compared to the hardness of said seal.

13. An electronic package comprising a graphite-metal matrix composite member for dissipating heat from a heat generating electronic component, an electrical feedthrough connector extending through an opening in said composite member, a hermetic glass seal in said opening between said composite member and said feedthrough connector, said glass seal comprising a low melting point glass having a coefficient of thermal expansion effective to form a glass-to-composite seal by mechanical compression sealing and chemical bond sealing, and reinforcement disposed about said glass seal and comprising a material that is relatively hard as compared to the hardness of said glass seal.

* * * * *